United States Patent
Korolenko et al.

(10) Patent No.: US 11,330,733 B2
(45) Date of Patent: May 10, 2022

(54) TRAY FOR ELECTRONIC COMPONENTS

(71) Applicant: YANDEX EUROPE AG, Lucerne (CH)

(72) Inventors: Andrey Olegovich Korolenko, Moscow (RU); Andrey Alekseevich Blokhin, Moscow (RU); Oleg Valerevich Fedorov, Moscow (RU); Igor Iurevich Znamenskii, d Drozhzhino (RU); Ivan Vladimirovich Prostov, Moscow (RU); Vladimir Viktorovich Khulagov, Balashikha (RU); Aleksandr Alekseevich Konovalov, Krasnogorsk (RU); Konstantin Aleksandrovich Klubnichkin, Moscow (RU); Nikita Aleksandrovich Vedeneev, Vladimir (RU)

(73) Assignee: YANDEX EUROPE AG, Lucerne (CH)

(*) Notice: Subject to any disclaimer, the term of this patent is extended or adjusted under 35 U.S.C. 154(b) by 0 days.

(21) Appl. No.: 17/207,041

(22) Filed: Mar. 19, 2021

(65) Prior Publication Data
US 2021/0378127 A1    Dec. 2, 2021

(30) Foreign Application Priority Data

Jun. 1, 2020  (RU) ................................ 2020117967

(51) Int. Cl.
*H05K 7/14*    (2006.01)
*H05K 7/20*    (2006.01)

(52) U.S. Cl.
CPC ......... *H05K 7/1489* (2013.01); *H05K 7/1487* (2013.01); *H05K 7/20145* (2013.01); *H05K 7/20172* (2013.01)

(58) Field of Classification Search
CPC .. G06F 1/20; H05K 7/20145; H05K 7/20727; H05K 7/20554; H05K 7/20172;
(Continued)

(56) References Cited

U.S. PATENT DOCUMENTS 8,335,076 B2  12/2012 Zhang
10,383,247 B2  8/2019 Chen et al.
(Continued)

FOREIGN PATENT DOCUMENTS

CN    104503536 A    4/2015

OTHER PUBLICATIONS

Notice of Allowance with regard to the counterpart U.S. Appl. No. 17/095,818 dated Jan. 5, 2022.
(Continued)

*Primary Examiner* — Mandeep S Buttar
(74) *Attorney, Agent, or Firm* — BCF LLP

(57) ABSTRACT

A tray for accommodating electronic components is disclosed. The tray has a body that defines a storage space for accepting electronic components in a side-by-side configuration. The body also defines a first airflow channel for guiding airflow from the storage space towards the outside of the body. The body has air inlets and air outlets for providing fluid communication with the storage space. The component bodies of the electronic components are configured to at least partially define a second airflow channel in the storage space for guiding, in use, the airflow from the air inlets to the air outlets, and has been selected for increasing a surface area of the first electronic component being in contact, in use, with the airflow in the storage space.

22 Claims, 9 Drawing Sheets

(58) Field of Classification Search
CPC .... H05K 7/20572; H05K 7/14; H05K 7/1487; H05K 1/0203; H05K 7/20136; H05K 7/20772; H05K 7/20709
USPC .............. 361/695, 697, 679.48, 692, 679.49, 361/679.46, 704, 679.5, 719, 690, 724, 361/797, 752; 165/80.3, 104.33, 80.2; 454/184, 237
See application file for complete search history.

(56) References Cited

U.S. PATENT DOCUMENTS

| | | | |
|---|---|---|---|
| 10,568,229 | B1 | 2/2020 | Ng et al. |
| 10,568,238 | B1 | 2/2020 | Leung et al. |
| 2013/0148297 | A1 | 6/2013 | Wei |
| 2014/0204525 | A1 | 7/2014 | Pecone et al. |
| 2015/0092340 | A1 | 4/2015 | Jau et al. |
| 2015/0216069 | A1 | 7/2015 | Hori |
| 2016/0219748 | A1 | 7/2016 | Tsai et al. |
| 2018/0332730 | A1 | 11/2018 | Konovalov et al. |
| 2021/0127522 | A1 | 4/2021 | Wang et al. |
| 2021/0400832 | A1* | 12/2021 | Gao .................... H05K 7/1487 |

OTHER PUBLICATIONS

Shen Yulong; Xu Jipeng; Li Minggang, "Server", Apr. 8, 2015, Inventec Technology CO LTD; Inventec Corp, Entire Document (Translation of CN 104503536). (Year 2015).

* cited by examiner

TRAY FOR ELECTRONIC COMPONENTS

FIELD OF TECHNOLOGY

The present technology relates to server racks, and more particularly, to a tray that facilitates cooling of, access to, and removal of electronic components.

BACKGROUND

A server is a central computer that typically serves computers in a network environment and provides necessary functionalities to these network computers such as storage, processing, and exchange of information. Conventional servers may be implemented similarly to conventional personal computers and generally comprise a central processing unit(s) (CPU), a memory(ies) as well as input/output device(s) which are all communicatively coupled together internally via a bus. These internal components of the server or server hardware operate according to inherent specifications and may be influenced by external factors such as temperature, humidity, pressure and the like.

A single server may be composed of a plurality of server racks, which accommodate the afore-mentioned server hardware. These server racks are generally implemented in a form of a server cabinet having electronic components arranged in a compact manner in order to minimize the room occupied by the server. The so-arranged server rack may be disposed in a factory, an engine room, a server farm or any other location suitable for physical storage of the server rack. When more than one server rack is required for implementing a server, the more than one server racks are usually disposed one next to the other so as to minimize the room occupied by the server.

Due to the compact stacking or arrangement of the server racks, some of the components of the server may be difficult to access during maintenance or repair of the server. Additionally, the proximity of internal components may have an effect on the performance of the server due to heat generation and its influence on inherent specifications of the internal components.

It should be noted that the server racks generate a considerable amount of heat which may hinder the computation performance of the server. In some cases, server racks are disposed in an air-cooled facility for reducing the ambient air temperature. Nevertheless, continuously air-cooling a facility storing a server is expensive and requires a considerable amount of electrical power.

SUMMARY

Embodiments of the present technology have been developed based on developers' appreciation that while the server racks arranged in a compact manner, the proximity of internal components of server racks may reduce their performance. Embodiments of the present technology have been developed based on developers' appreciation of at least one technical problem associated with the prior art solutions. Therefore, developers have devised a chassis for a server rack, and which accommodates trays for electronic components and which allows increasing cooling performance of the electronic components.

Developers of the present technology have realized that positioning of electronic components inside one or more trays of the chassis may influence the cooling efficiency of the electronic components. It should be noted that a number of factors may affect cooling of electronic components, and which include inter alia the position of a given electronic component in the tray, the operating temperature of the given component in the tray, operating temperature of neighboring electronic components in the tray, proximity amongst electronic components in the tray, a total number of electronic components in the tray, air temperature of the airflow in different locations inside the tray, a surface area of the given electronic component which is in contact with the airflow during operation, and the like.

Developers of the present technology have realized the need for positioning electronic components inside the tray in such a manner that increases the surface area of the electronic components that is in contact with the airflow during operation. In at least some embodiments of the present technology, at least some surfaces of the electronic components are used to define an airflow channel inside the tray. It is contemplated that the tray described herein includes structural components that may at least partially define three airflow channels of the tray: (i) a tray airflow channel for guiding airflow from the outside of the tray, through a bottom of the tray and into a storage space of the tray accommodating the electronic components, (ii) a storage space airflow channel for guiding the airflow (having entered the storage space) in a particular manner so as to increase the surface area of the electronic components that are in contact with the airflow inside the storage space, and (iii) a body airflow channel for guiding the airflow (having cooled down the electronic components) on the sides of the tray and towards the back portion of the tray where the airflow expelled from the tray.

In one broad aspect of the present technology, there is provided a tray for accommodating electronic components. The electronic components have pre-determined dimensions. The tray is configured to be installable in a server rack. The tray comprises a body. The body includes, a bottom panel, a top panel, a first outer sidewall and a second outer sidewall that longitudinally extend along the body and located on respective sides of the bottom panel and of the top panel, a front wall that extends between the first outer sidewall and the second outer sidewall at a front of the body, a first inner sidewall and a second inner sidewall that longitudinally extend from the front wall along the body and located between the first outer sidewall and the second outer sidewall, and an inner back wall that extends between the first inner sidewall and the second inner sidewall at the back of the first inner sidewall and the second inner sidewall. The bottom panel, the top panel, the front wall, the first inner sidewall, the second inner sidewall, and the back inner wall define a storage space in the body for accepting, in use, the at least one electronic component. The bottom panel, the top panel, the front wall, the first inner sidewall, the second inner sidewall, the back inner wall, the first outer sidewall, and the second outer sidewall define a first airflow channel in the body for guiding airflow from the storage space towards the outside of the body. The bottom panel defines air inlets. The air inlets are for providing fluid communication between the storage space in the body and the outside of the body. The first inner sidewall and the second inner sidewall define air outlets. The air outlets are for providing fluid communication between the storage space and the first airflow channel of the body. The tray comprises a first electronic component and a second electronic component, and each includes a respective component body having a component front wall, a component back wall, two component sidewalls, a top component wall, and a bottom component wall. The component front wall, the component back wall, the component bottom wall, the two component side walls, and the top component wall together define a substantially rectangular shape of the respective component body that has the pre-determined dimensions. The component bodies are removably stored side-by-side in the storage space such that one component sidewall of the first electronic component and one component sidewall of the second electronic component face each other when stored side-by-side in the storage space. The component bodies of the first electronic component and of the second electronic component are configured to at least partially define a second airflow channel in the storage space for guiding, in use, the airflow from the air inlets to the air outlets. The second airflow channel is defined by a first spacing between the component bottom wall and the bottom panel, a second spacing between the other one component sidewall of the first electronic device and an associated one of the first inner sidewall and the second inner sidewall, a third spacing between the component top wall and the top panel, and a fourth spacing between the one component sidewall of the first electronic component and the one component side wall of the second electronic component that face each other. The first spacing, the second spacing, the third spacing, and the fourth spacing have been selected for increasing a surface area of the first electronic component being in contact, in use, with the airflow in the storage space.

In some embodiments of the tray, the air inlets comprise (i) a first plurality of apertures defined in the bottom panel in proximity to one of the first inner sidewall and the second inner side wall, and (ii) a second plurality of apertures defined in the bottom panel in proximity to the other one of the first inner sidewall and the second inner sidewall.

In some embodiments of the tray, the first plurality of apertures and the second plurality of apertures are spaced along the bottom panel.

In some embodiments of the tray, the air outlets comprise (i) a third plurality of apertures defined in one of the first inner sidewall and the second inner sidewall and in proximity to the top panel, and (ii) a fourth plurality of apertures defined in the other one of the first inner sidewall and the second inner sidewall and in proximity to the top panel.

In some embodiments of the tray, apertures of the third plurality of apertures have non-equal cross-sections.

In some embodiments of the tray, a first cross-section of a first aperture of third plurality of apertures located at a first distance to the inner back wall is larger than a second cross-section of a second aperture of the third plurality of apertures located at a second distance. The first distance is larger than the second distance.

In some embodiments of the tray, the second spacing is substantially smaller in size than the first spacing.

In some embodiments of the tray, the third spacing is substantially the same size as the first spacing.

In some embodiments of the tray, the fourth spacing is substantially the same size as the first spacing.

In some embodiments of the tray, second spacing is substantially smaller in size than any one of the first spacing, the third spacing and the fourth spacing.

In some embodiments of the tray, the first spacing is about 5 mm.

In some embodiments of the tray, the second spacing is about 1 mm.

In some embodiments of the tray, the third spacing is about 5 mm.

In some embodiments of the tray, the fourth spacing is about 5 mm.

In some embodiments of the tray, the tray further comprises, inside the storage space, a cage structure for receiving the first electronic component. The cage structure for the first electronic component is configured for positioning the first electronic component in the storage space so as to provide the first spacing, the second spacing, the third spacing, and the fourth spacing.

In some embodiments of the tray, the cage structure has a sidewall facing the associated one of the first inner sidewall and the second inner sidewall of the first electronic component. The sidewall defines a set of apertures for selectively matching a set of air outlets amongst the air outlets of the associated one of the first inner sidewall and the second inner sidewall of the first electronic component. The cage structure is longitudinally movable in the storage space between a first position and a second position, (i) such that in the first position the set of apertures longitudinally match the set of air outlets so as to allow the fluid communication between the storage space and the first airflow channel through the set of air outlets, and (ii) such that in the second position the set of apertures are longitudinally offset from the set of air outlets so as to interrupt the fluid communication between the storage space and the first airflow channel through the set of air outlets.

In some embodiments of the tray, the tray is a first tray, stackable in use, above a second tray which defines a fifth spacing therebetween.

In some embodiments of the tray, the fifth spacing is about 6 mm.

In some embodiments of the tray, the bottom panel of the first tray and the top panel of the second tray are configured to at least partially define a third airflow channel. The third airflow channel is defined by the fifth spacing.

In some embodiments of the tray, the first electronic component in an HDD component.

In some embodiments of the tray, the tray configured to be installable in the server rack comprises the tray being accommodated inside a chassis. The tray is slidably movable in the chassis. The chassis is configured to be installable in the server rack.

In some embodiments of the tray, a fan is provided at a back of the chassis and is removably attached to the chassis wall. The fan causes airflow sequentially: from the third airflow channel, through the air inlets, through the second airflow channel in the storage space, through the air outlets, through the first airflow channel in the body, and towards the outside of the body.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

These and other features, aspects and advantages of the present technology will become better understood with regard to the following description, appended claims and accompanying drawings where:

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements which, although not explicitly described or shown herein, nonetheless embody the principles of the present technology and are included within its spirit and scope.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Figure 1:
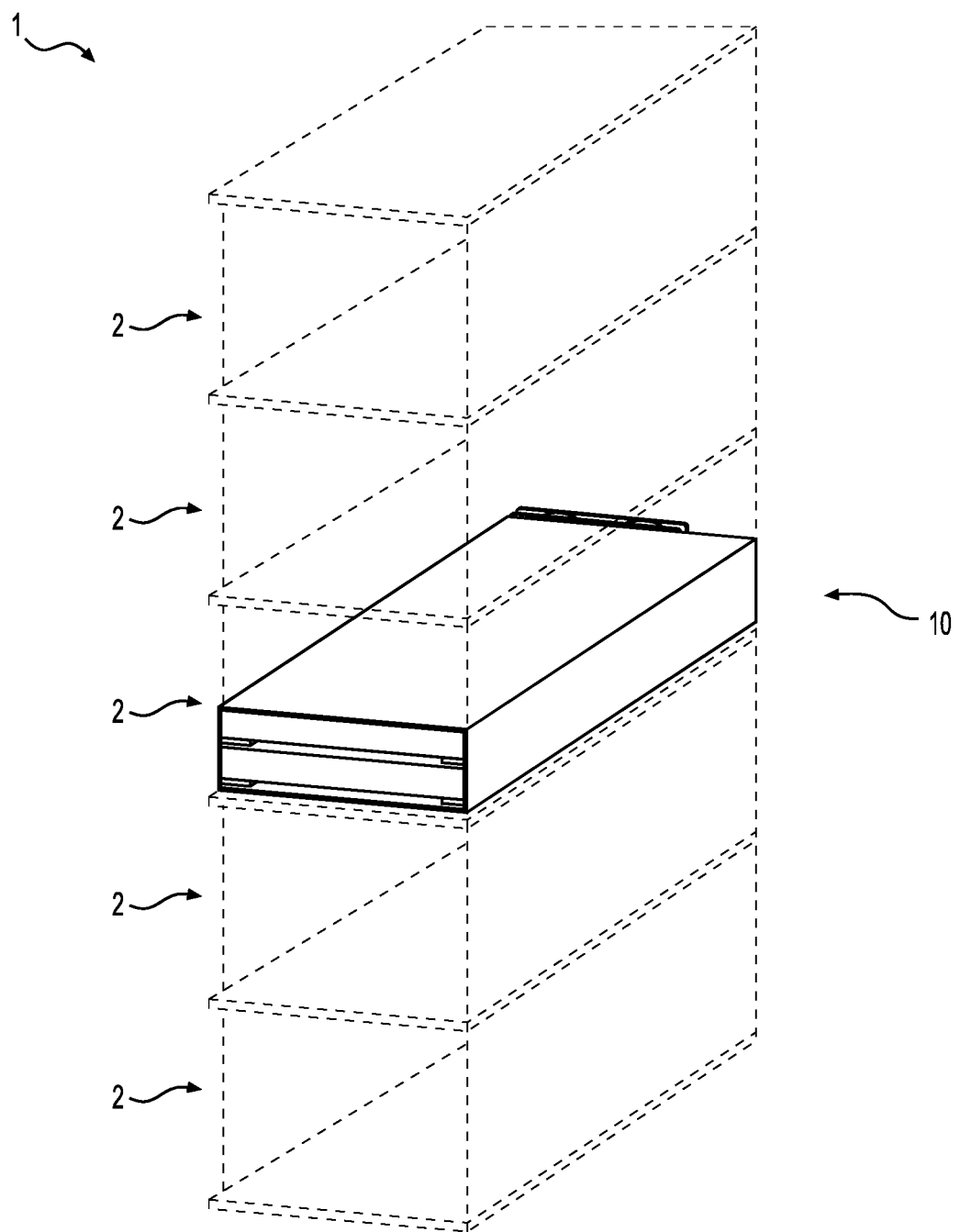
FIG. 1 is a front left perspective view of a server rack accommodating a chassis.

With reference to FIG. 1, there is depicted a server rack 1 (in dotted lines) accommodating a chassis 10 amongst a plurality of chassis (not depicted). For example, the server rack 1 defines a plurality of chassis slots 2, each of which may receive a respective chassis 10. It can be said that the chassis 10 is installable into a respective chassis slot 2 of the server rack 1. In some embodiments, the chassis 10 may be snuggly fitted into the respective chassis slot 2 of the server rack 1.

Broadly speaking, one or more electronic components in the chassis 10 of the server rack 1 is configured to process processable requests and/or tasks for an external client. For example, data indicative of a given processable request may be acquired by one or more electronic components of the chassis 10. This data may be then processed and/or stored by the one or more electronic components of the chassis 10. How the chassis structure 10 is implemented in at least some embodiments of the present technology will now be described in greater detail with reference to FIG. 2.

Chassis

Figure 2:
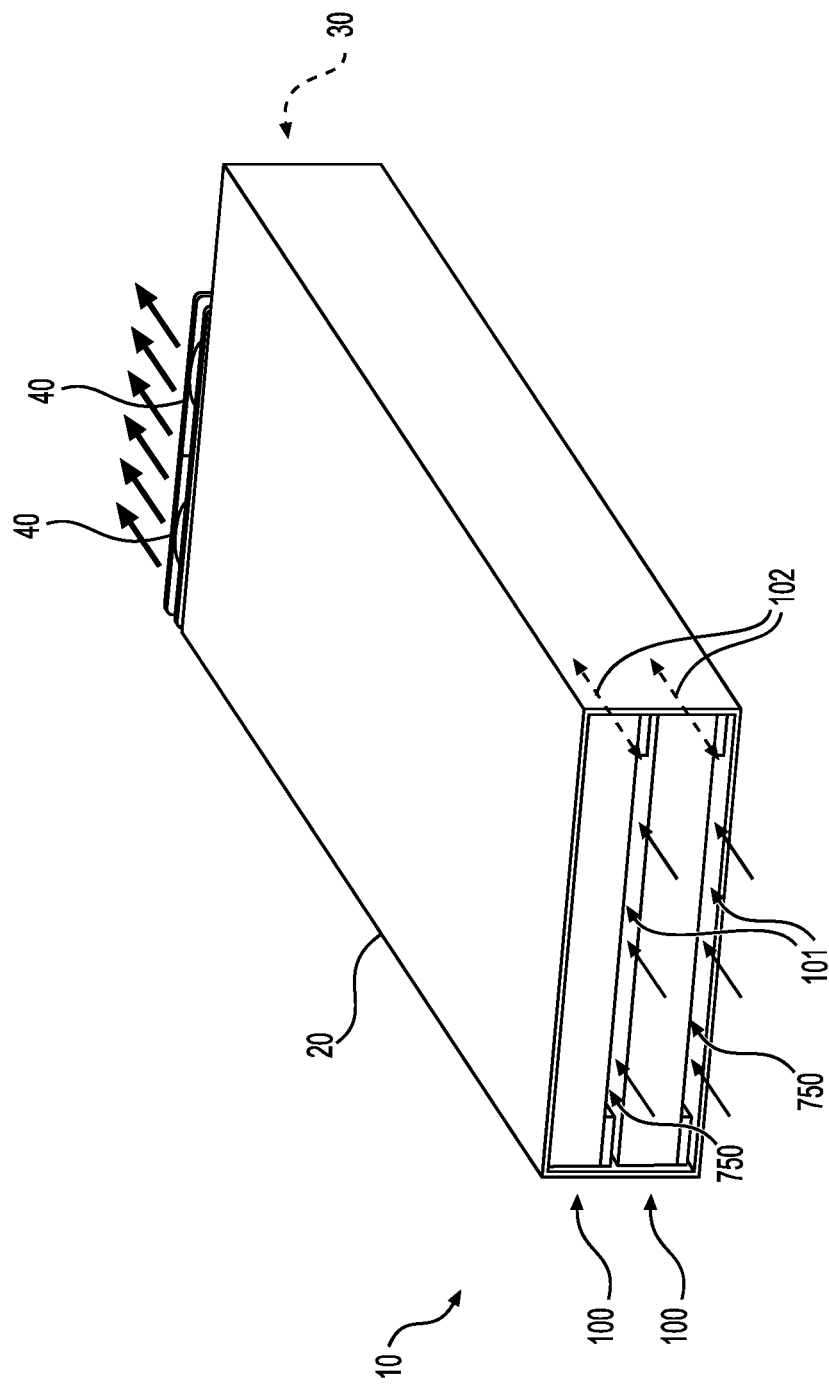
FIG. 2 is a front left perspective view of the chassis of FIG. 1 having two trays stacked one over the other.

As illustrated in FIG. 2, the chassis 10 has "an outer shell" or body 20 having a back chassis wall 30. The back chassis wall 30 at the back of the body 20 defines a plurality of apertures (not numbered and not visible in FIG. 2) for allowing fluid communication between an inside of the body 20 with an outside of the body 20 through the back chassis wall 30. Also, it should be noted that the chassis 10 includes fans 40 which are removably affixed to the back chassis wall 30 through the plurality of apertures such that they are aligned with the respective ones of the plurality of apertures of the back chassis wall 30.

The body 20 of the chassis 10 accommodates two trays 100. It can be said that the two trays 100 of the chassis 10 are stackable one over the other in the body 20. It should also be noted that, during operation, each one of the trays 100 can be independently slideably longitudinally moved between (i) a received position in the chassis 10 (as seen in FIG. 2) and (ii) one or more withdrawn positions (not depicted). For example, a given one of the trays 100 can be independently slideably longitudinally moved in accordance with a movement direction 102.

As it will become apparent from the description herein further below, a given tray 100 may be independently slideably longitudinally moved between different positions so as to provide access for an operator's hands for replacing and/or performing maintenance on at least some of electronic components accommodated in the given tray 100.

In at least some embodiments of the present technology, the independent slideable longitudinal movement of the given tray 100 may be enabled by a sliding assembly (not depicted). How the sliding assembly is implemented is not particularly limiting. However, it should be noted that the sliding assembly may include one or more structural components of the body 20 and the given tray 100, without departing from the scope of the present technology.

It should be noted that the two trays 100 are stacked, one over the other, so as to define tray spacings 101. For example, one of the tray spacings 101 is defined in between the trays 100, while the other one of the tray spacings 101 is defined in between a bottom panel of the body 20 and the corresponding (lower) tray 100. As it will become apparent from the description herein further below, with a brief reference to FIG. 7, a given tray spacing 101 may define a "tray airflow channel" 750 for cooling at least some electronic components inside the trays 100. For example, during operation, the fans 40 may be configured to generate a low pressure zone inside the chassis 10 at the back of the chassis 10 which generates an airflow through the chassis 10 and the trays 100. As illustrated by the arrows in FIG. 2, air may enter the chassis 10 via these tray airflow channels 750 defined by the spacings 101, pass through the trays 100, thereby cooling at least some electronic components accommodated therein, and be expelled from the chassis 10 at the back through the plurality of apertures associated with the fans 40. It should be noted that the airflow entering the trays 100 includes air at a lower temperature than the airflow exiting the trays 100 at the back of the chassis 10.

Figure 3:
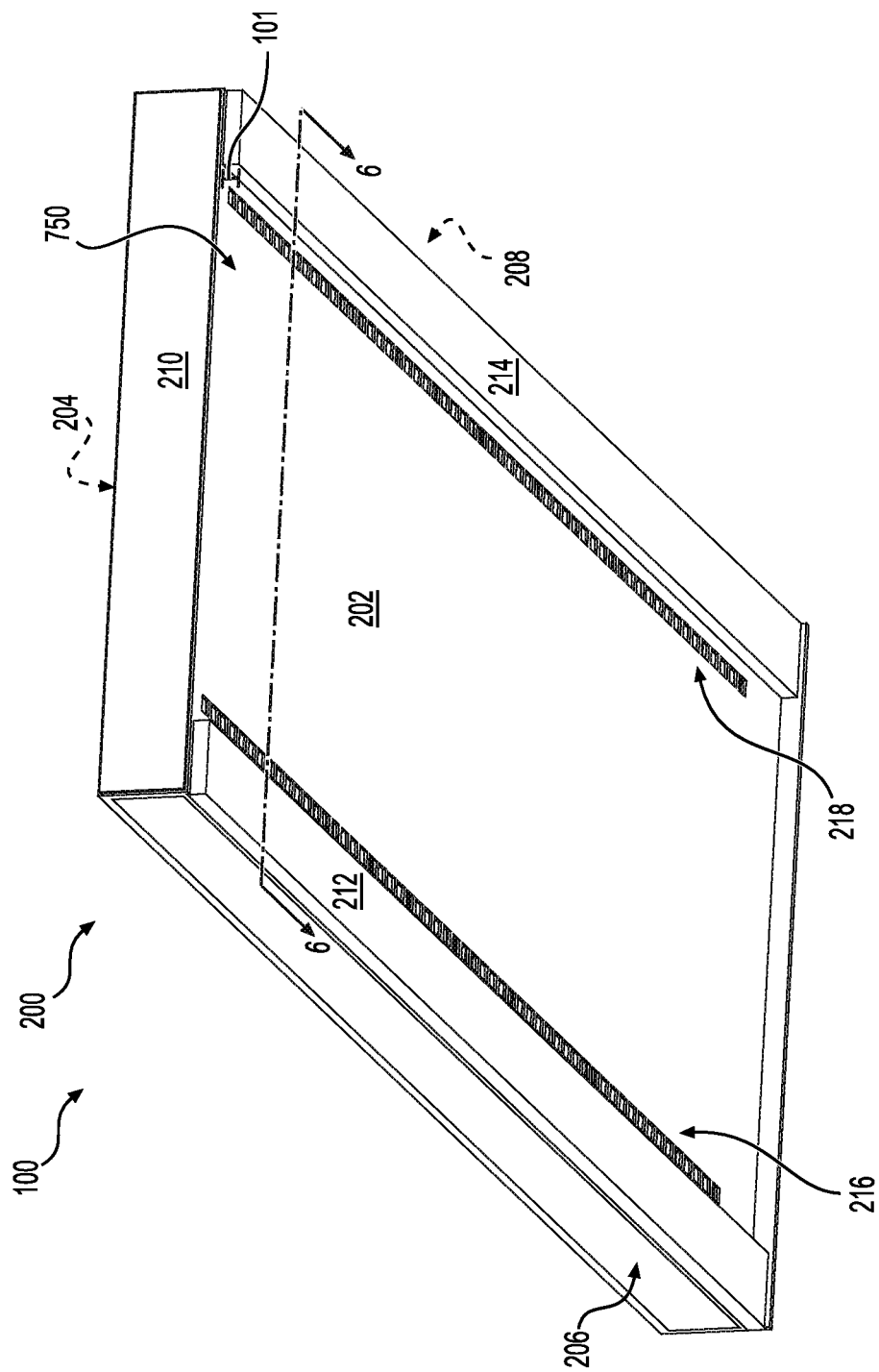
FIG. 3 is a front right perspective view of one of the trays of FIG. 1, the perspective view being from a bottom of the one of the trays of FIG. 1.

Developers of the present technology have devised the tray 100 that can guide the airflow therethrough during operation in a particular manner. More specifically, a given tray 100 may be configured to provide one or more airflow channels inside the tray 100 so as to increase a surface area of the internal electronic components that is in contact with the airflow passing through the given tray 100. How the tray 100 is configured in at least some embodiments of the present technology will now be described with reference to both FIGS. 3 and 4.

Tray

The tray 100 includes a body 200. The body 200 comprises inter alia a bottom panel 202, a top panel 204, a front wall 210, a first outer sidewall 206, and a second outer sidewall 208. The first outer sidewall 206 and the second outer sidewall 208 longitudinally extend along the body 200 and are located on respective sides of the bottom panel 202 and of the top panel 204. The front wall 210 extends between the first outer sidewall 206 and the second outer sidewall 208 at a front of the body 200.

It is contemplated that in at least some embodiments of the present technology, the bottom panel 202, the top panel 204, the front wall 210 the first outer sidewall 206, and the second outer sidewall 208 may be integrally formed—that is, the bottom panel 202, the top panel 204, the first outer sidewall 206, and the second outer sidewall 208 may be provided as a "single-piece" outer shell configured to accommodate inner structural components of the tray 100.

As it can be seen, the bottom panel 202 is configured to define a portion of the tray spacing 101. For example, a bottom surface of the bottom panel 202 may protrude downwardly on each side thereof so as to define protrusions 212 and 214. Alternatively, spacers may be provided on a generally flat bottom surface of the bottom panel 202 for defining the tray spacing 101. Optionally, any other structural means may be used for providing the tray spacing 101.

The body 200 also comprises a first inner sidewall 306 and a second inner sidewall 308. The first inner sidewall 306 and the second inner sidewall 308 longitudinally extend from the front wall 210 along the body 200 and are located between the first outer sidewall 206 and the second outer sidewall 208. The body 200 also comprises an inner back wall 310 that extends between the first inner sidewall 306 and the second inner sidewall 308 at the back of the first inner sidewall 306 and the second inner sidewall 308.

Figure 4:
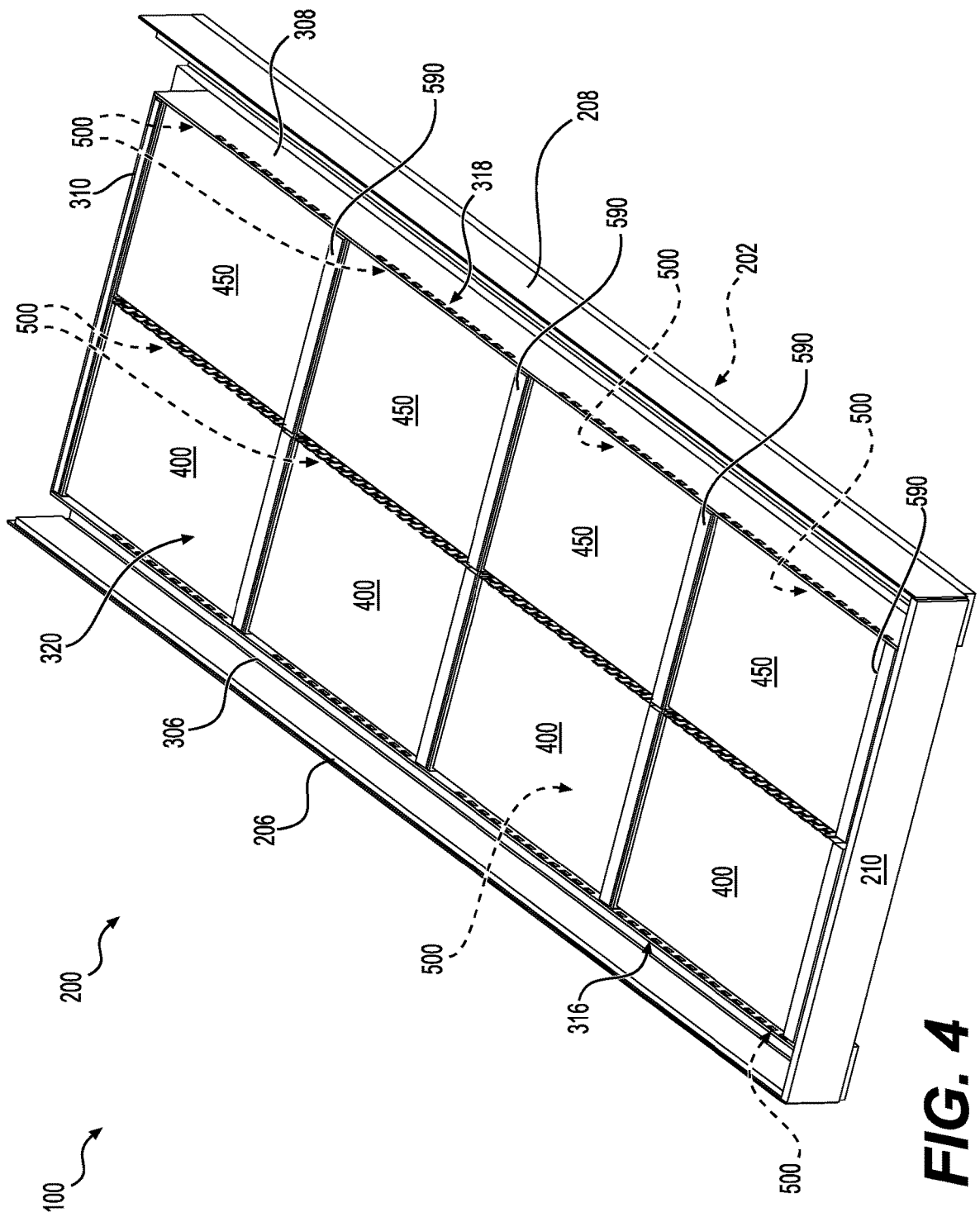
FIG. 4 is a front left perspective view of the tray of FIG. 3 accepting a plurality of electronic components and a top panel thereof being omitted.

As seen in FIG. 4, the bottom panel 202, the top panel (omitted in FIG. 4 for clarity purposes), the front wall 210, the first inner sidewall 306, the second inner sidewall 308, and the back inner wall 310 define a storage space 320 in the body 200 of the given tray 100 for accepting, in use, electronic components 400 and 450. The electronic components 400 are electronic components that are positioned in the storage space 320 in proximity to the first inner sidewall 306 while the electronic components 450 are electronic components that are positioned in the storage space 320 in proximity to the second inner sidewall 308. For example, the electronic components 400 and 450 may be respective Hard Disk Drive (HDD) components.

Broadly speaking, the electronic components 400 and 450 are removably stored in the storage space 320 in a "side-by-side" configuration. As seen, the electronic components 400 and 450 are positioned in four rows, each row having a pair of electronic components including a given electronic component 400 and a corresponding side-by-side electronic component 450. Rows of electronic components are separated by transverse walls 590. As it will become apparent from the description herein further below, in at least some embodiments, the transverse walls 590 may be configured to at least partially define "airflow zones" inside the storage space 320 associated with respective electronic components.

It should be noted that in the side-by-side configuration of electronic components 400 and 450, in a given row having a given pair of electronic components, a given sidewall (of a component body) of a first one of the given pair of electronic components faces an other given sidewall (of a component body) of a second one of the given pair of electronic components. As it will become apparent from the description herein further below, this pair of facing sidewalls (see sidewall 406 and sidewall 455 in FIG. 8) may at least partially define a given airflow channel inside the storage space 320.

It should be noted that the bottom panel defines "air inlets" that provide fluid communication between the outside of the tray 100 and the storage space 320 in the tray 100. As it can be seen in FIG. 3, in the depicted non-limiting embodiment of the present technology, these air inlets of the bottom panel 202 comprise a first plurality of apertures 216 defined in the bottom panel 202 in proximity to the first inner sidewall 306 and a second plurality of apertures 218 defined in the bottom panel 202 in proximity to the second inner sidewall 308. It is contemplated that the first plurality of apertures 216 and the second plurality of apertures 218 may be spaced along the bottom panel 202 and where the "inter-aperture" spacings (not numbered) can be selected by a designer in different ways for a specific implementation of the present technology.

It can be said that the first inner sidewall 306 longitudinally extends from the front wall 210 along the body 200 and is located between the first outer sidewall 206 and the first plurality of apertures 216 so that the first plurality of apertures 216 provides fluid communication between the outside of the tray 100 and the storage space 320 in the tray 100. It can also be said that the second inner sidewall 308 longitudinally extends from the front wall 210 along the body 200 and is located between the second outer sidewall 208 and the second plurality of apertures 218 so that the second plurality of apertures 218 provides fluid communication between the outside of the tray 100 and the storage space 320 in the tray 100.

As previously alluded to, the tray spacing 101 defines the tray airflow channel 750 in between the bottom panel 202 of the illustrated tray 100 and the top panel 204 of the other tray 100 (not illustrated in FIG. 4) or the body 20 of the chassis 10. As it will be described in greater details herein further below, the tray airflow channel 750 is configured to guide airflow, during operation, from the outside of the chassis 10 towards the air inlets (e.g., the first plurality of apertures 216 and the second plurality of apertures 218) defined in the bottom panel 202.

It should also be noted that the first inner sidewall 306 and the second inner sidewall 308 define "air outlets" that provide fluid communication between the inside of the storage space 320 in the tray 100 and the outside of the storage space in the tray 100. As it can be seen in FIG. 4, these air outlets comprise a third plurality of apertures 316 defined in the first inner sidewall 306 and in proximity to the top panel 204 (omitted for clarity purposes in FIG. 4), and (ii) a fourth plurality of apertures 318 defined in the second inner sidewall 308 and in proximity to the top panel 204. It can be said that the air inlets may be configured to let (low temperature) air enter the storage space 320, as opposed to the air outlets that may be configured to let (comparatively high temperature) air exit the storage space 320.

As it will become apparent from the description herein further below, this "directionality" of airflow through the air inlets and through the air outlets may be beneficial for increasing the cooling performance of the tray 100 since air that has been used to cool down a given electronic component will not be used again to cool down any other electronic component in the storage space 320 and will rather be expelled outside the tray 100 at the back of the tray 100.

In some non-limiting embodiments of the present technology, apertures from the third plurality of apertures 316 and/or the fourth plurality of apertures 318 may have non-equal cross-sections. For example, the cross-sections of apertures in any one of the third plurality of apertures 316 and the fourth plurality of apertures 318 may increase in accordance with their longitudinal position in a corresponding inner sidewall, from the front to the back of the corresponding inner sidewall. In another example, the cross-sections of apertures in any one of the third plurality of apertures 316 and the fourth plurality of apertures 318 may decrease in accordance with their longitudinal position in a corresponding inner sidewall, from the front to the back of the corresponding inner sidewall.

In at least one embodiment, it can be said that a first cross-section of a first aperture of the third plurality of apertures 316 (or of the fourth plurality of apertures 318) located at a first distance to the inner back wall 310 is larger than a second cross-section of a second aperture of the third plurality of apertures 316 (or of the fourth plurality of apertures 318) located at a second distance to the inner back wall 310, and where the first distance is larger than the second distance.

As it will also become apparent from the description herein further below, the first inner sidewall 306 and the second inner sidewall 308 vertically extend above the electronic components 400 and 450 (when the electronic components 400 and 450 are accepted in the storage space 320) such that the first inner sidewall 306 and the second inner sidewall 308 define the third plurality of apertures 316 and the fourth plurality of apertures 318, respectively, vertically above the component bodies of the electronic components 400 and 450.

Figure 8:
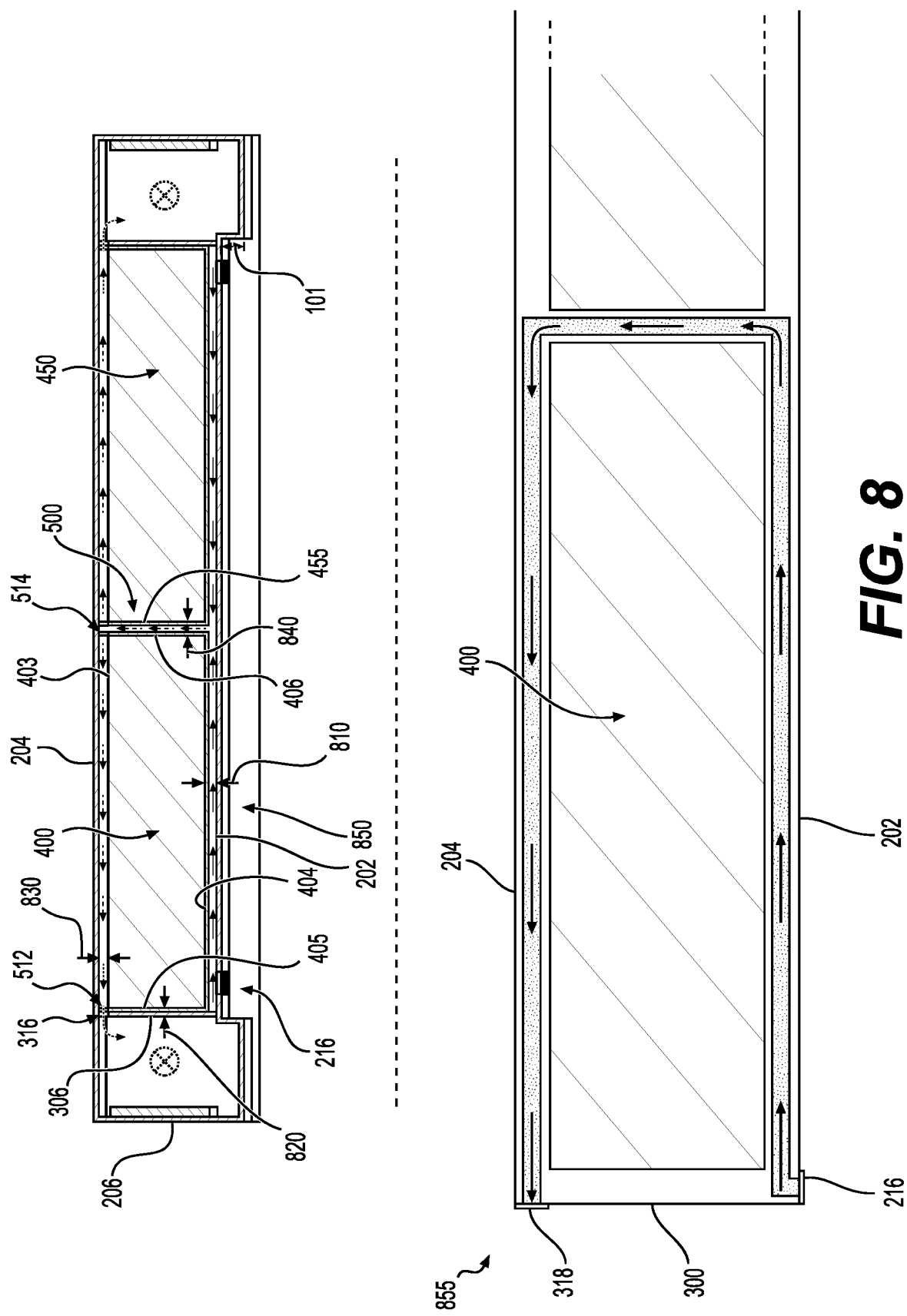
FIG. 8 is a cross-sectional front plane view of the tray of FIG. 3 obtained through a plane 6-6 of FIG. 3.

It should be noted that in at least some embodiments of the present technology, the developers of the present technology have devised the tray 100 for accepting electronic components in the storage space 320, and which electronic components are positionable in the storage space 320 in a particular manner—that is, with quick reference to FIG. 8, the electronic components 400 and 450 may be positioned inside the storage space 320 during operation in a manner that provides a "storage space" airflow channel 850 for guiding the airflow inside the storage space 320 from the air inlets of the bottom panel 202 to the air outlets in the first and second inner sidewalls 306 and 308, and so as to increase the surface area of the electronic components 400 and 450 that is in contact with the airflow in the storage space 320.

It should be noted that the tray 100 is devised by the developers of the present technology in a manner that allows providing a given storage space airflow channel 850 for respective ones of the electronic components 400 and 450. In other words, the tray 100 may be configured to provide a plurality of storage space airflow channels similarly to how the storage space airflow channel 850 is provided for a given electronic component 400. How the storage space airflow channel 850 is provided for a given electronic component 400 will be described in greater details herein further below with reference to both FIGS. 6 and 8.

Also, developers of the present technology have devised the tray 100 that may enable a similar cooling performance for (i) a given electronic component accepted at the back of the storage space 320 and (ii) an other given electronic component accepted at the front of the storage space 320. As it will become apparent form the description herein further below, this may be achieved at least partially by using (i) the tray airflow channel 750 providing air of a same (low) temperature to each electronic component inside the storage space 320, and (ii) a "body airflow channel" 950 (see FIG. 9) in the tray 100 allowing not to re-use air for cooling purposes and which has already been used for cooling down a given electronic component. The body airflow channel 950 may be used, during operation, for guiding airflow from the storage space 320 towards the outside of the body 200 at the back of the body 200.

Cage Structure

It should be noted that one or more structural components may be configured to position the electronic devices 400 and 450 in the storage space 320. For example, with reference to FIG. 5, there is depicted a cage structure 500 for receiving a given electronic component 400. It should be noted, however, that each one of the electronic components 400 and of the electronic components 450 may be received by a respective cage structure 500 when positioned in the storage space 320.

A given electronic component 400 has a front component wall 401, a back component wall 402, two component sidewalls 405 and 406, a bottom component wall 404 and a top component wall 403. The front component wall 401, the back component wall 402, the two component sidewalls 405 and 406, the bottom component wall 404 and the top component wall 403 together defining a substantially rectangular shape of the respective component body and which has pre-determined dimensions.

It can be said that the cage structure 500 is configured to position the electronic component 400 in the storage space 320 so as to provide the storage space airflow channel 850 for the respective electronic component 400. How the cage structure 500 is configured to so-position the electronic components 400 in the storage space 320 will be described in greater details herein further below.

The cage structure 500 has a first cage sidewall 502, a second cage sidewall 504, and a floor 506. When the electronic component 400 is received in the cage structure 500, the bottom surface 404 is resting on the floor 506. It should be noted that the first cage sidewall 502 faces the first inner sidewall 306 when positioned in the storage space 320. The second cage sidewall 504 faces a first cage sidewall 502 of a corresponding "side-by-side" cage structure 500 (not depicted in FIG. 5 for clarity purposes, but can be seen on FIG. 4) of the corresponding "side-by-side" electronic component 450 (not depicted in FIG. 5 for clarity purposes, but can be seen on FIG. 4).

The first cage sidewall 502 defines a set of apertures 512 while the second cage sidewall 504 defines an other set of apertures 514. It should be noted that the set of apertures 512 may be used in combination with a set of apertures 346 from the third plurality of apertures 316 in the first inner sidewall 306 for interrupting fluid communication between a part of the storage space 320 dedicated for receiving the corresponding electronic component 400 and the outside of the storage space 320. In one non-limiting implementation of the present technology, the set of apertures 346 may include sixteen apertures and the third plurality of apertures 316 may include sixty-four apertures (sixteen for each of the four rows of electronic components in the storage space 320).

Therefore, it is contemplated that in at least some embodiments of the present technology, each one of (i) the first plurality of apertures 216 (air inlets), (ii) the second plurality of apertures 218 (air inlets), (iii) the third plurality of apertures 316 (air outlets), and (iv) the fourth plurality of apertures 318 (air outlets) may be further grouped into a number of sets of apertures that is equal to a number of rows of electronic components inside the storage space 320. That way, each one of the electronic components 400 and 450 may be associated with a respective set of apertures defined in the bottom panel 202 (air inlets for the respective electronic component) and with a respective set of apertures defined in a given inner sidewall (air outlets for the respective electronic component).

Figure 5:
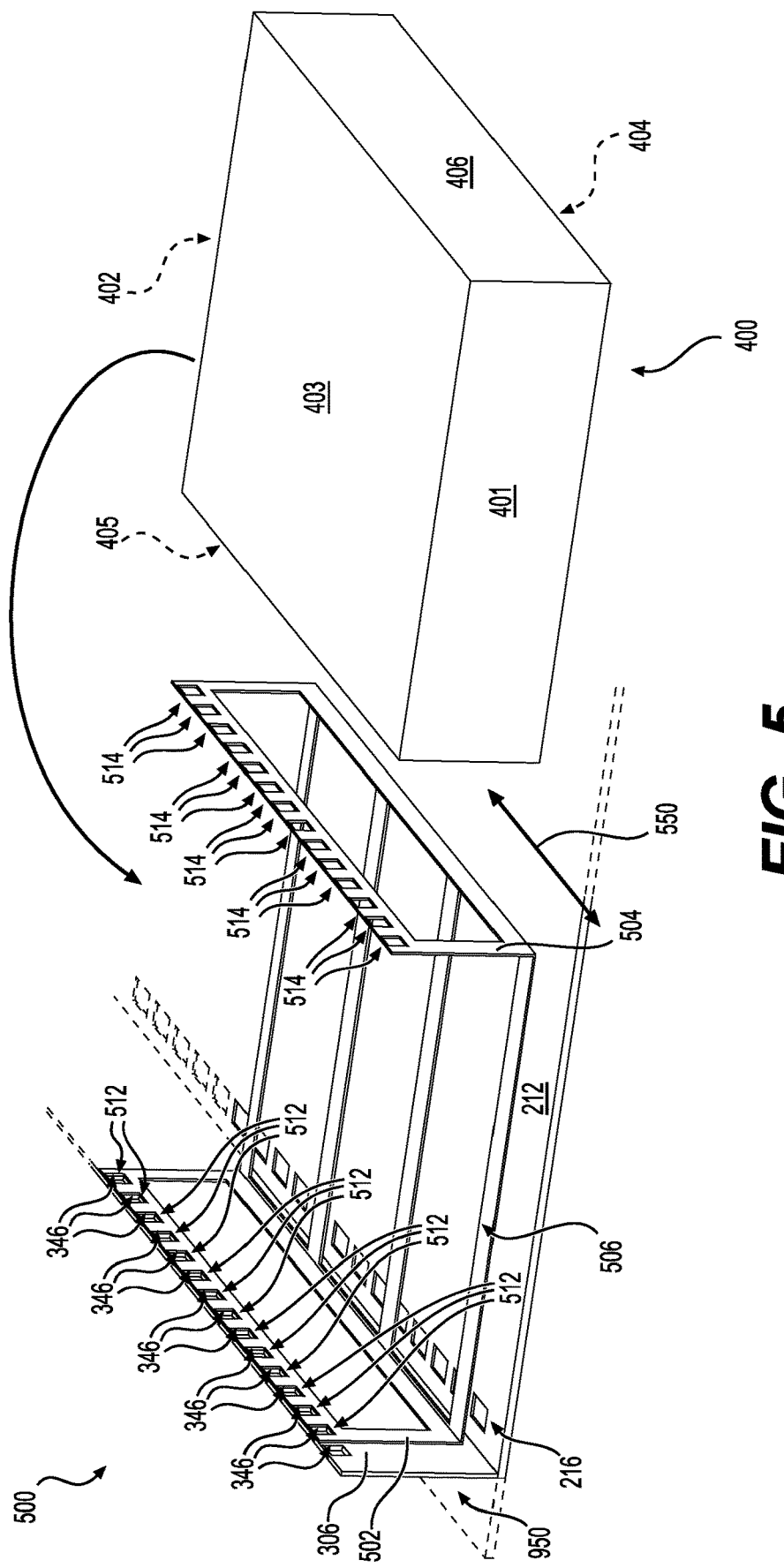
FIG. 5 is a schematic illustration of a cage structure and of a given electronic component of FIG. 4 accepted in the tray of FIG. 3.

It is contemplated that the cage structure 500 may be longitudinally movable in the storage space 320 between at least two positions in accordance with a movement direction 550. For example, in a first position (as illustrated in FIG. 5) the set of apertures 512 in the first cage sidewall 502 longitudinally match the set of apertures 346 (e.g., which are dedicated for the corresponding electronic component 400) in the first inner sidewall 306 so as to allow the fluid communication between (i) a portion of the storage space 320 dedicated to the corresponding electronic component 400 (e.g., the airflow zone associated with the corresponding electronic component 400) and (ii) the body airflow channel 950. In a same example, in a second position (not depicted) the set of apertures 512 in the first cage sidewall 502 are longitudinally offset from the set of apertures 346, so as to interrupt the fluid communication between (i) a portion of the storage space 320 dedicated to the electronic component 400 and (ii) the body airflow channel 950. Thus, in at least some embodiments, it can be said that the set of apertures 512 may be used for selectively matching the set of apertures 346 amongst the third plurality of apertures 316 for providing and/or interrupting fluid communication between the storage space 320 and the body airflow channel 950 through the set of apertures 346. It can also be said that the set of apertures 512 may be used for selectively matching the set of apertures 346 amongst the third plurality of apertures 316 for providing and/or interrupting fluid communication between the airflow zone of the corresponding electronic component and the body airflow channel 950.

It can further be said that the set of apertures 514 of a given cage structure 500 of a given electronic component 450 may be used for selectively matching a set of apertures amongst the fourth plurality of apertures 318, mutatis mutandis, for providing and/or interrupting fluid communication between the airflow zone of the corresponding electronic component 450 and the body airflow channel 950.

Cooling

As previously mentioned, in at least some embodiments of the present technology, the developers of the present technology have devised the tray 100 (receivable in the chassis 10) that at least partially defines three airflow channels for guiding the airflow generated by the fans 40 through the tray 100 for cooling the electronic components 400 and 450 inside the tray 100. These airflow channels are namely: (i) the tray airflow channel 750 best seen in FIG. 7, (ii) the storage space airflow channel 850 best seen in FIG. 8, and (iii) the body airflow channel 950 best seen in FIG. 9. It should be noted that during operation, the fans 40 generate the airflow passing through the tray 100 via the airflow channels in the immediately above-listed order. What path the air being used for cooling the electronic components 400 and 450 takes during operation of the tray 100 will now be described.

Figure 6:
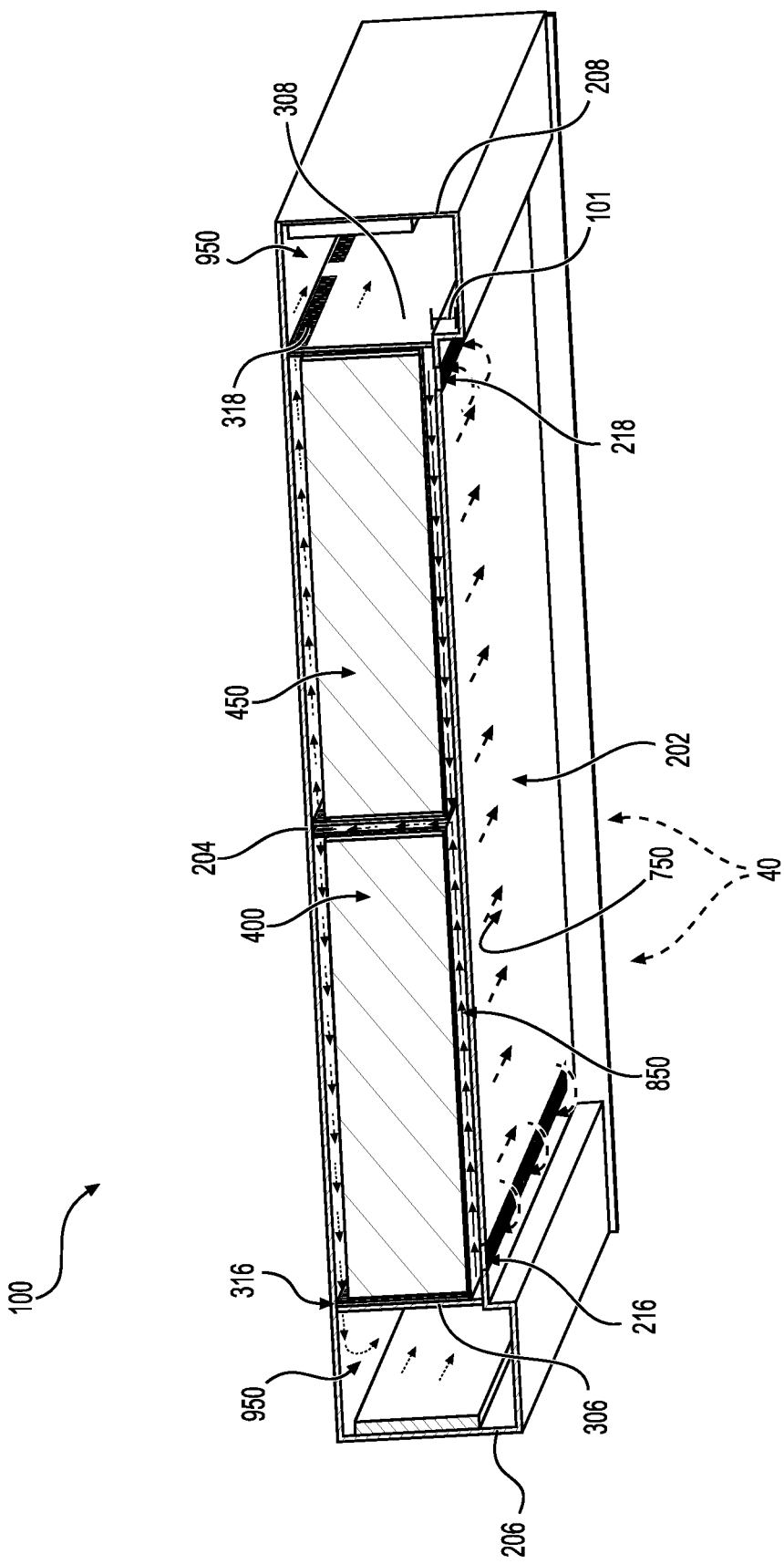
FIG. 6 is a cross-sectional front left perspective view of the tray of FIG. 3 obtained through a line 6-6 of FIG. 3.
Figure 7:
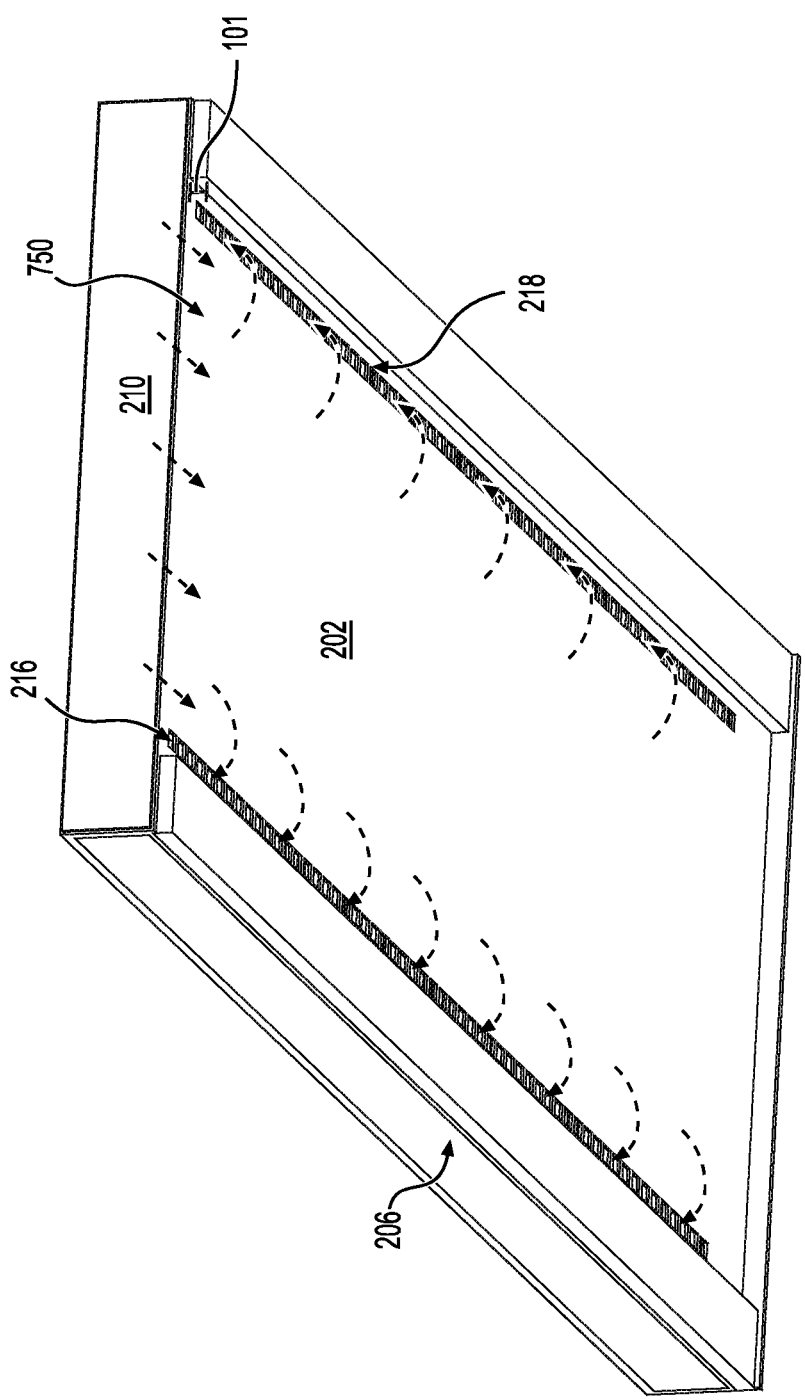
FIG. 7 is a front right perspective view of the tray of FIG. 3.

With reference to both FIGS. 6 and 7, when the fans 40 are operating, a low pressure zone is created by the fans 40 at the back of the tray 100. This results in an airflow passing though the tray 100. The air is dragged from the front of the tray 100 and is initially guided by the tray airflow channel 750 towards the air inlets located in the bottom panel 202 of the tray 100. As mentioned above, the tray airflow channel 750 is defined by the tray spacing 101. In some implementations, the tray spacing 101 may be about 6 mm in height.

Recalling that the air inlets provide fluid communication between the outside of the tray 100 and the storage space 320 in which the electronic components 400 and 450 are positioned, the air passing through the air inlets of the bottom panel 202 is to be used for cooling the electronic components 400 and 450 inside the tray 100.

It should be noted that the tray airflow channel 750 at the bottom of the tray 100 and the air inlets longitudinally defined in the bottom panel 202 allow providing outside air of a same (low) temperature for each one of the electronic components 400 and 450. As a result, the air entering the storage space 320 is of a substantially the same (low) temperature irrespective of whether this air enters near the front of the storage space 320 and/or near the back of the storage space 320.

With reference to both FIGS. 6 and 8, once the (low temperature) air enters the storage space 320, the air is guided by the storage space airflow channel 850 for cooling the respective electronic component 400. Although description will now be provided for the storage space airflow channel 850 of a given electronic component 400, it should be noted that each electronic component 400 and 450 is associated with a similar storage space airflow channel to the storage space airflow channel 850 depicted in FIG. 8, mutatis mutandis. A representation 855 is depicted in FIG. 8 for illustrating the path that the air takes when guided by the storage space airflow channel 850.

It should be noted that the storage space airflow channel 850 for the given electronic component 400 is defined by a first spacing 810, a second spacing 820, a third spacing 830, and a fourth spacing 840. As best seen in FIG. 8, the first spacing 810 is a spacing between (i) the component bottom wall 404 of the electronic component 400 and (ii) the bottom panel 202. The second spacing 820 is a spacing between (i) the sidewall 405 of the electronic component 400 and (ii) the first inner sidewall 306. The third spacing 830 is a spacing between (i) the component top wall 403 of the electronic component 400 and (ii) the top panel 204 of the tray 100. The fourth spacing 840 is a spacing between (i) the sidewall 406 of the electronic component 400 (i.e., the opposite component sidewall of the electronic component 400 to the component sidewall facing the first inner sidewall 306 of the tray 100) and (ii) a component sidewall 455 of the electronic component 450. It can be said that the fourth spacing 840 may be a spacing between a pair of facing component sidewalls of a pair of side-by-side electronic components (e.g., the component sidewall 406 of the electronic component 400 and the component sidewall 455 of the electronic component 450) in the storage space 320.

In some embodiments of the present technology, the storage space airflow channel 850 for the given electronic component 400 or 450 can further be defined by two additional spacings. For example, these two additional spacings may include, a back spacing being between (i) the back wall of the component body of the given electronic component 400 or 450 and (ii) one of the transverse wall 590 and the back inner wall 310 (depending on the position of the given electronic component 400 or 450 in the storage space 320), and a front spacing being between (i) the front wall of the component body of the given electronic component 400 or 450 and (ii) a corresponding transverse wall 590.

It should be noted that the first spacing 810, the second spacing 820, the third spacing 830, and the fourth spacing 840 have been selected for increasing a surface area of the electronic component 400 being in contact, in use, with the airflow in the storage space 320. It should be noted that each of the electronic components 400 and of the electronic component 450 may be associated with a corresponding storage space airflow channel at least partially defined by four spacings, mutatis mutandis.

As previously alluded to, the electronic device 400 may be positioned in the storage space 320 so as to provide the first spacing 810, the second spacing 820, the third spacing 830, and the fourth spacing 840. In one non-limiting example, the cage structure 500 may be configured to so-position the corresponding electronic component 400 in the storage space 320. In one non-limiting implementation of the present technology, the first spacing is about 5 mm, the second spacing is about 1 mm, the third spacing is about 5 mm, and the fourth spacing is about 5 mm. In at least some embodiments, a given sidewall of the cage structure 500 may have a thickness equal to the second spacing 820.

As mentioned above, the storage spacing airflow channel 850 may further be defined by the back spacing and the front spacing. It is contemplated that the back and the front spacings may be substantially the same size as the second spacing 820. For example, the back and the front spacings may be about 1 mm. In some embodiments, the front and the back spacings may allow for longitudinal movement of the respective cage structures 500.

In at least some embodiments of the present technology, it is contemplated that the first spacing 810 and the second spacing 820 may be selected by a designer such that the second spacing 820 is smaller in size than the first spacing 810. It is contemplated that the first spacing 810 and the third spacing 830 may be selected by the designer such that the third spacing 830 is substantially the same size than the first spacing 810. It is also contemplated that the first spacing 810 and the fourth spacing 840 may be selected by the designer such that the fourth spacing 840 is substantially the same size than the first spacing 810. It is further contemplated that second spacing 820 may be selected by a designer such that the second spacing 820 is smaller in size than any one of the first spacing 810, the third spacing 830 and the fourth spacing 840.

It should be noted that absolute measures of the first spacing 810, the second spacing 820, the third spacing 830, and the fourth spacing 840 are less important than their relative measures to each other. In other words, what is important is that the measures of the first spacing 810, the second spacing 820, the third spacing 830, and the fourth spacing 840 (and in some cases, the back and the front spacings) are selected such that the airflow inside the storage space 320 is not guided, from the air inlets to the air outlets, through the room provided by the second spacing 820, but rather through the room provided by the first spacing 810, the third spacing 830, and the fourth spacing 840. This way, the surface area of the electronic component 400 that will be in contact with the airflow in the storage space 320 will comparatively increase—that is, the surface area of the electronic component 400 that is in contact with the airflow if the airflow is guided through the room provided by the second spacing 820 is smaller than the surface area of the electronic component 400 that is in contact with the airflow if the airflow is guided through the room provided the first spacing 810, the third spacing 830, and the fourth spacing 840.

When the air enters the storage space 320 through the first plurality of apertures 216 in the bottom panel 202 (e.g., air inlets associated with the electronic components 400), the airflow is guided by the storage space airflow channel 850 and takes the air path as seen in the representation 855—that is, the airflow is guided through the room provided by the first spacing 810, the third spacing 830, and the fourth spacing 840 around the electronic component 400 and towards the air outlets associated with the electronic component 400 (e.g., at least some of the third plurality of apertures 316 in the first inner sidewall 306). It should be noted that so-increasing the surface area of the given electronic component 400 which is in contact with the airflow in the storage space 320 results in an increased cooling of the given electronic component 400.

It should be noted that the temperature of the air passing through the air inlets is lower than the air temperature of the air passing through the air outlets. This is due to heat transfer from the "air-contacted" surfaces of the electronic component 400 and the air. Developers of the present technology have realized that there is a need for a given tray where the air having been used for cooling down one of the electronic components 400 and/or 450 is not used again for cooling down other electronic components amongst 400 and 450 due to the higher temperature of this air as mentioned above. Therefore, the developers of the present technology have devised the tray 100 having the body airflow channel 950 that allows evacuating the high temperature air having been used for cooling down a given electronic component from the tray 100, without it coming into contact with other electronic components 400 and/or 450 in the tray 100. How the body airflow channel 950 is used during operation will now be described with reference to both FIGS. 6 and 9.

Figure 9:
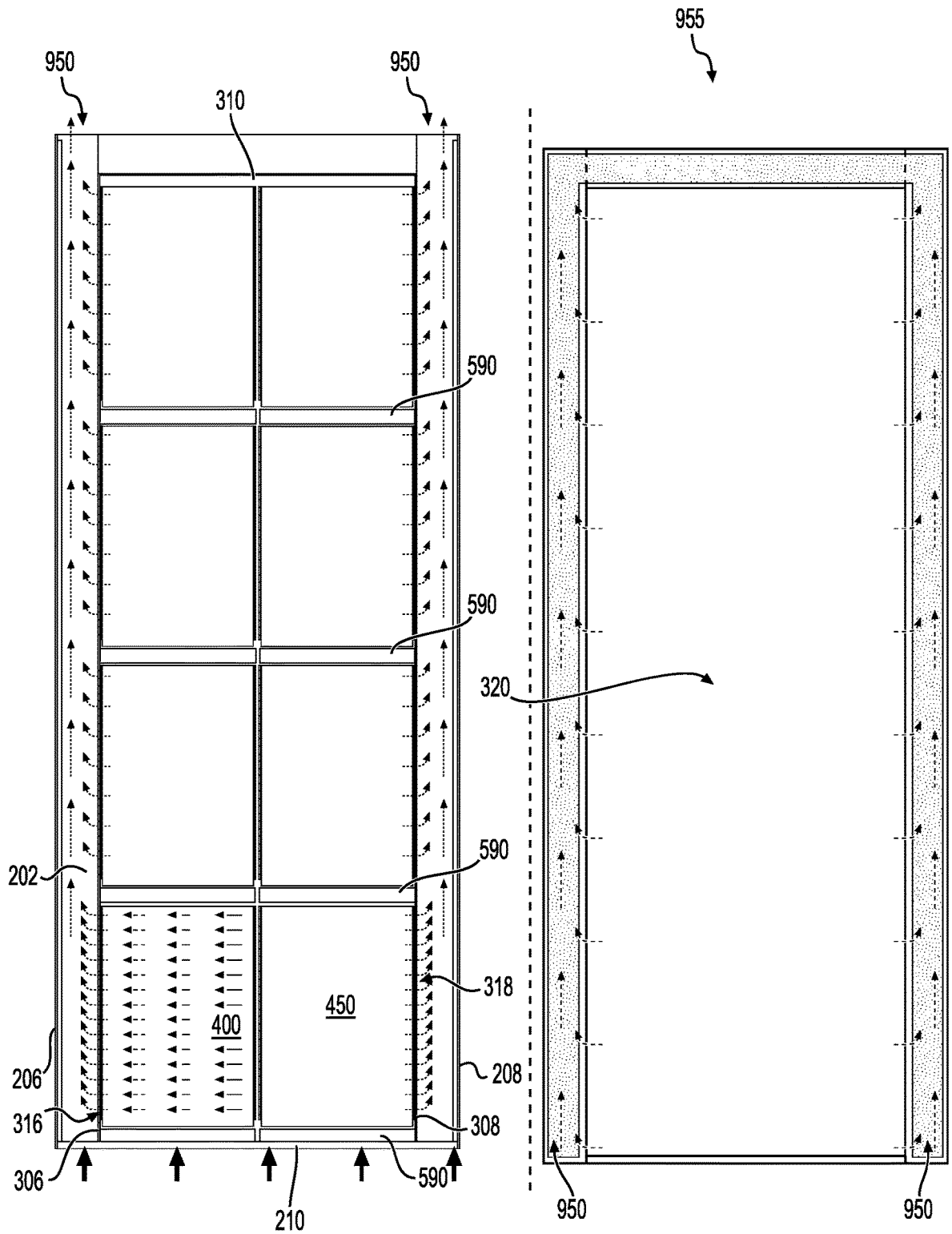
FIG. 9 is a top plane view of the tray of FIG. 4.

Once the air having been used to cool down the electronic components 400 and 450 passes through the air outlets of the inner sidewalls 306 and 308, this air enters the body airflow channel 950. A representation 955 is depicted in FIG. 9 for illustrating the path that the air takes when guided by the body airflow channel 950.

It can be said that the room provided between the first inner sidewall 306 and the first outer sidewall 206 may be used for defining the body airflow channel 950. Similarly, it can be said that the room provided between the second inner sidewall 308 and the second outer sidewall 208 may be used for defining the body airflow channel 950.

The air that enters the body airflow channel 950 through the air outlets is guided by the body airflow channel towards the back of the tray 100 (as seen in the representation 955) where the low pressure zone is created by the fans 40. This high temperature air is expelled by the fans 40 from the inside of the tray 100 towards the outside of the tray 100 at the back of the chassis 10. Recalling that the directionality of airflow through the air outlets is (i) from the inside of the storage space 320 and (ii) towards the outside of the storage space 320, once the air has entered the body airflow channel 950, this air is no longer used for cooling down other ones of the electronic components 400 and 450.

In summary, it can be said that in at least one embodiment of the present technology, once the fans 40 cause the airflow through the tray 100, the air:
- is guided from the front of the tray 100 at the bottom of the tray 100 by the tray airflow channel 750 towards the air inlets in the bottom panel 202 of the tray 100—at least one advantage of the tray airflow channel 750 is provision of air at a same (low) temperature for each one of the electronic components 400 and 450;
- is guided from the air inlets towards the air outlets inside the storage space 320 by respective ones of a plurality of storage space airflow channels (not numbered) that are defined similarly to how the storage space airflow channel 850 is defined for the given electronic component 400 in FIG. 8—at least one advantage of the storage space airflow channel 850 is the increase of the surface area of the respective electronic component 400 or 450 that is in contact with the airflow guided thereby; and is guided from the air outlets towards the back of the tray 100 by the body airflow channel 950—at least one advantage of the body airflow channel 950 is the ability to guide air having been used for cooling a respective electronic component (high temperature air) towards the outside of the tray 100 without being in contact with any other electronic component in the storage space 320.

In some embodiments of the present technology, and as previously alluded to, the storage space 320 may be partitioned into a plurality of "airflow zones" (not numbered). Each airflow zone may be dedicated to a corresponding electronic component amongst the electronic components 400 and 450. For example, a given electronic component 400, a respective cage structure 500, and the respective storage space airflow channel 850 may be located in the airflow zone of the storage space 320 dedicated to the given electronic component 400. It should be noted that this airflow zone for the given electronic component is (i) longitudinally located in between the nearest transverse walls 590 to the given electronic component 400, (ii) laterally located between the nearest inner sidewall and the corresponding airflow zone of the side-by-side electronic component 450, and (iii) vertically located between the bottom panel 202 and the top panel 204.

In some cases, the given electronic component 400 may be missing or withdrawn for maintenance from the storage space 320. In these cases, it may be desirable to at least partially "isolate" the respective airflow zone by longitudinally moving the respective cage structure 500 from the first position into the second position as explained above. This isolation of the airflow zone may be performed similarly and independently for different airflow zones (for respective missing or withdrawn electronic components). This isolation may allow interrupting fluid communication between the respective airflow zone and the body airflow channel 950 through the respective air outlets when the given electronic component 400 or 450 is missing. So-interrupting fluid communication between the airflow zone of the missing electronic component and the body airflow channel through the respective air outlets allows a more efficient use of the airflow for cooling the rest of electronic components that are located in the storage space 320.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

The invention claimed is:

1. A tray for accommodating electronic components, the electronic components having pre-determined dimensions, the tray configured to be installable in a server rack, the tray comprising:
    a body including:
        a bottom panel;
        a top panel;
        a first outer sidewall and a second outer sidewall longitudinally extending along the body and located on respective sides of the bottom panel and of the top panel,
        a front wall extending between the first outer sidewall and the second outer sidewall at a front of the body;
        a first inner sidewall and a second inner sidewall longitudinally extending from the front wall along the body and located between the first outer sidewall and the second outer sidewall;
        an inner back wall extending between the first inner sidewall and the second inner sidewall at the back of the first inner sidewall and the second inner sidewall;
        the bottom panel, the top panel, the front wall, the first inner sidewall, the second inner sidewall, and the back inner wall defining a storage space in the body for accepting, in use, the at least one electronic component,
        the bottom panel, the top panel, the front wall, the first inner sidewall, the second inner sidewall, the back inner wall, the first outer sidewall, and the second outer sidewall defining a first airflow channel in the body for guiding airflow from the storage space towards the outside of the body;
        the bottom panel defining air inlets, the air inlets for providing fluid communication between the storage space in the body and the outside of the body;
        the first inner sidewall and the second inner sidewall defining air outlets, the air outlets for providing fluid communication between the storage space and the first airflow channel of the body;
    a first electronic component and a second electronic component, each including:
        a respective component body having:
            a component front wall;
            a component back wall;
            two component sidewalls;
            a top component wall;
            a bottom component wall;
        the component front wall, the component back wall, the component bottom wall, the two component side walls, and the top component wall together defining a substantially rectangular shape of the respective component body having the pre-determined dimensions;
        the component bodies being removably stored side-by-side in the storage space such that one component sidewall of the first electronic component and one component sidewall of the second electronic component face each other when stored side-by-side in the storage space;
        the component bodies of the first electronic component and of the second electronic component configured to at least partially define a second airflow channel in the storage space for guiding, in use, the airflow from the air inlets to the air outlets, the second airflow channel being defined by:
            a first spacing between the component bottom wall and the bottom panel;
            a second spacing between the other one component sidewall of the first electronic device and an associated one of the first inner sidewall and the second inner sidewall;
            a third spacing between the component top wall and the top panel; and
            a fourth spacing between the one component sidewall of the first electronic component and the one component side wall of the second electronic component that face each other; and
            the first spacing, the second spacing, the third spacing, and the fourth spacing having been selected for increasing a surface area of the first electronic component being in contact, in use, with the airflow in the storage space.

2. The tray of claim 1, wherein the air inlets comprise (i) a first plurality of apertures defined in the bottom panel in proximity to one of the first inner sidewall and the second inner side wall, and (ii) a second plurality of apertures defined in the bottom panel in proximity to the other one of the first inner sidewall and the second inner sidewall.

3. The tray of claim 2, wherein the first plurality of apertures and the second plurality of apertures are spaced along the bottom panel.

4. The tray of claim 1, wherein the air outlets comprise (i) a third plurality of apertures defined in one of the first inner sidewall and the second inner sidewall and in proximity to the top panel, and (ii) a fourth plurality of apertures defined in the other one of the first inner sidewall and the second inner sidewall and in proximity to the top panel.

5. The tray of claim 4, wherein apertures of the third plurality of apertures have non-equal cross-sections.

6. The tray of claim 5, wherein a first cross-section of a first aperture of third plurality of apertures located at a first distance to the inner back wall is larger than a second cross-section of a second aperture of the third plurality of apertures located at a second distance, the first distance being larger than the second distance.

7. The tray of claim 1, wherein the second spacing is substantially smaller in size than the first spacing.

8. The tray of claim 1, wherein the third spacing is substantially the same size as the first spacing.

9. The tray of claim 1, wherein the fourth spacing is substantially the same size as the first spacing.

10. The tray of claim 1, wherein second spacing is substantially smaller in size than any one of the first spacing, the third spacing and the fourth spacing.

11. The tray of claim 1, wherein the first spacing is about 5 mm.

12. The tray of claim 1, wherein the second spacing is about 1 mm.

13. The tray of claim 1, wherein the third spacing is about 5 mm.

14. The tray of claim 1, wherein the fourth spacing is about 5 mm.

15. The tray of claim 1, wherein the tray further comprises, inside the storage space, a cage structure for receiving the first electronic component,
the cage structure for the first electronic component being configured for positioning the first electronic component in the storage space so as to provide the first spacing, the second spacing, the third spacing, and the fourth spacing.

16. The tray of claim 15, wherein the cage structure has a sidewall facing the associated one of the first inner sidewall and the second inner sidewall of the first electronic component, the sidewall defining a set of apertures for selectively matching a set of air outlets amongst the air outlets of the associated one of the first inner sidewall and the second inner sidewall of the first electronic component, the cage structure being longitudinally movable in the storage space between a first position and a second position, such that:
in the first position:
the set of apertures longitudinally match the set of air outlets so as to allow the fluid communication between the storage space and the first airflow channel through the set of air outlets; and
in the second position:
the set of apertures are longitudinally offset from the set of air outlets, so as to interrupt the fluid communication between the storage space and the first airflow channel through the set of air outlets.

17. The tray of claim 1, wherein the tray is a first tray, stackable in use, above a second tray defining a fifth spacing therebetween.

18. The tray of claim 17, wherein the fifth spacing is about 6 mm.

19. The tray of claim 17, wherein the bottom panel of the first tray and the top panel of the second tray are configured to at least partially define a third airflow channel, the third airflow channel being defined by the fifth spacing.

20. The tray of claim 1, wherein the first electronic component in an HDD component.

21. The tray of claim 1, wherein the tray configured to be installable in the server rack comprises the tray being accommodated inside a chassis, the tray being slidably movable in the chassis, the chassis being configured to be installable in the server rack.

22. The tray of claim 21, wherein a fan is provided at a back of the chassis and is removably attached to the chassis wall, the fan for causing airflow sequentially:
from the third airflow channel;
through the air inlets;
through the second airflow channel in the storage space;
through the air outlets;
through the first airflow channel in the body; and
towards the outside of the body.

* * * * *